United States Patent
Arik et al.

(10) Patent No.: US 10,506,703 B2
(45) Date of Patent: Dec. 10, 2019

(54) LIGHT ENGINE SYSTEM PREFERRED IN LED-BASED LIGHTING SYSTEMS

(71) Applicant: OZYEGIN UNIVERSITESI, Istanbul (TR)

(72) Inventors: Mehmet Arik, Istanbul (TR); Ferina Saati Khosroshahi, Istanbul (TR)

(73) Assignee: OZYEGIN UNIVERSITESI, Istanbul (TR)

(*) Notice: Subject to any disclaimer, the term of this patent is extended or adjusted under 35 U.S.C. 154(b) by 0 days.

(21) Appl. No.: 15/759,310

(22) PCT Filed: Nov. 4, 2016

(86) PCT No.: PCT/TR2016/050426
§ 371 (c)(1),
(2) Date: Mar. 12, 2018

(87) PCT Pub. No.: WO2017/086893
PCT Pub. Date: May 26, 2017

(65) Prior Publication Data
US 2018/0184513 A1   Jun. 28, 2018

(30) Foreign Application Priority Data
Nov. 20, 2015   (TR) .............................. a 2015 14689

(51) Int. Cl.
*H05K 1/02* (2006.01)
*H05K 1/05* (2006.01)
(Continued)

(52) U.S. Cl.
CPC ......... *H05K 1/0209* (2013.01); *F21V 23/005* (2013.01); *F21V 29/51* (2015.01);
(Continued)

(58) Field of Classification Search
CPC ....... H05K 1/0209; H05K 1/056; F21V 29/51
(Continued)

(56) References Cited

U.S. PATENT DOCUMENTS 7,786,501 B2 * 8/2010 Shen .................. H01L 21/4846
257/100
2007/0018191 A1 * 1/2007 Roh .................... G02B 6/0073
257/99
(Continued)

FOREIGN PATENT DOCUMENTS

KR   100961104 B1   6/2010

OTHER PUBLICATIONS

Written Opinion of the ISA and International Search Report for corresponding PCT/TR2016/050426.

*Primary Examiner* — Mukundbhai G Patel
(74) *Attorney, Agent, or Firm* — Egbert Law Offices, PLLC

(57) ABSTRACT

Disclosed is a PCB used in multifunctional LED applications, having an electronic side with circuit components and a LED side with lighting components; which has at least one metal surface coated on the ground of the mentioned electronic side, at least one metal surface coated on the ground of the mentioned LED surface, or at least one pipe located in the inner cross-section of the mentioned PCB in order to reduce the heating generated on the mentioned PCB by dissipating it over the surface of board.

5 Claims, 4 Drawing Sheets

(51) Int. Cl.
*F21V 23/00* (2015.01)
*F21V 29/51* (2015.01)
*F21Y 115/10* (2016.01)

(52) U.S. Cl.
CPC .......... *H05K 1/056* (2013.01); *F21Y 2115/10* (2016.08); *H05K 2201/064* (2013.01); *H05K 2201/09027* (2013.01); *H05K 2201/10106* (2013.01)

(58) Field of Classification Search
USPC ........................................................ 361/720
See application file for complete search history.

(56) References Cited

U.S. PATENT DOCUMENTS

| | | | |
|---|---|---|---|
| 2008/0144315 A1 | 6/2008 | Chen et al. | |
| 2008/0265781 A1* | 10/2008 | Lin | F21K 9/00 315/113 |
| 2010/0193807 A1 | 8/2010 | Park | |
| 2011/0211351 A1 | 9/2011 | Van De Ven et al. | |
| 2013/0099101 A1* | 4/2013 | Campbell | G01S 7/4813 250/208.2 |
| 2013/0193592 A1* | 8/2013 | Peil | F21K 9/00 257/791 |
| 2013/0271992 A1 | 10/2013 | Kim et al. | |

* cited by examiner

LIGHT ENGINE SYSTEM PREFERRED IN LED-BASED LIGHTING SYSTEMS

TECHNICAL FIELD

Present invention is related to PCB structures allowing the use of multifunctional LEDs in automotive and other lighting applications.

Present invention is particularly related to innovative solution applications developed for heating problems of PCBs.

BACKGROUND OF THE INVENTION

Various PCB (Printed Circuit Board) structures are used to allow the use of multifunctional LEDs (light emitting diodes) in automotive industry applications. While in traditional systems, materials with low-conductivity are used as PCB technology.

In another example application, FR4-based printed circuit technology is used. Potential disadvantages of this type of units are centered on the formation of local hotspots up to temperatures 20-30° C. above the maximum permissible temperatures. LEDs have a rapidly increasing performance in terms of light output. The efficiency of LEDs when used for lighting purposes in automotive industry is a proven fact. However, heat produced by diodes necessitates the use of heat shields or certain additional components for heat dissipation, resulting in a rise in the cost of lamps, in addition to some certain disadvantages arising out of very high heat flow produced by low-power chips in a very small space. When LED resources are intensively used, e.g. in headlight applications, light output increases, but the resulting heat becomes a significant problem. What's more, batch intensity of LEDs further leads to a physical problem both in itself and outside. In the state of the art, there are some patents dealing with double-sided support boards of LED lighting units. In those patents, it is noted that the areas of back plate localizing the support board are in interaction with certain indents created on the second side of the support board. In general applications, these boards are plastic-based (FR4) materials. Manufacturers are unaware of local hotspots, because LED technology is not widely used yet. Standard printed boards are FR4 boards with very low conductivity and affordable prices, as well as ceramic and direct-bonded copper constructions with better conductivity but higher prices and less durability. Large cooling components and extra materials are required to cool down the traditionally and habitually used FR4 board. For example, thermal by-products, thermal paths and screws are used therein. This kind of design further requires a high level of hand-workmanship for assembly works.

In the case of multifunctional use of LEDs, LEDs are combined with cutting edge PCB technology. In the relevant application, a series of LEDs are assembled on the first side of the support board. LEDs stand upright on the support board, and an electrical circuit is formed on the support board to supply power to LEDs. Said PCBs can be made of fiberglass, plastic, composite epoxy or other laminated materials. Some solutions for cooling are employed in PCB applications. Examples of cooling apparatuses include:

Such an apparatus is described in the patent application no. KR20120136527 titled "Heat-pipe integrated one body type PCB using thin film vapor deposition method for LED light". In the said patent application, a PCB structure linked to a hollow metal body is described. Accordingly, the hollow metal body carries respectively an insulating film layer, a thin vapor deposition film layer, a copper layer and an insulating layer. A similar study is described also in the patent application no. KR20140099603. In the patent application no. KR20080062093 titled "Low voltage back light unit that is made mixing chip LED a attach PCB composition of special protection against heat structure and special processing acryl plate glass composition", cooling holes and heat sinks opened on PCB having LED chips on both sides are described.

Another apparatus is defined in the patent application no. KR100953857 titled "A PCB unified with soft silicon pad for high speed heat dissipation of LED and the method thereof". In the said patent application, a PCB with LED illuminators on one side and heat sinks on the other side are described. For applications with similar heat sinks, the patent applications no. KR100990331, CN102182992, CN202125895, KR101329703 can be shown as examples.

Another apparatus is described in the patent application no. KR101049887 titled "Metal PCB structure for radiant heat improvement and circuit protection of LED lighting device". In the said patent application, epoxy-heat band layers used for heat dissipation within PCB cross-section are described.

These examples have a common basic property, characterized in that they are related to apparatuses having only LED structures on PCB and having heat sinks or similar cooling apparatuses on the other side. Cooling designs, developed for limited spaces, providing specific solutions with regard to automotive applications are needed.

In order to eliminate the disadvantages specified above, solutions are developed for PCBs used in LED lighting apparatuses in automotive industry, and having an electronic circuit on one side and LED lighting components on the other side.

DESCRIPTION OF THE INVENTION

Departing from the state of the art, this invention aims to eliminate the existing disadvantages through improvements made in PCBs in LED lighting apparatuses used especially in automotive industry.

Another purpose of the invention is to enable dissipation of heat generated in PCBs over the board. Thus, probable negative effects of high temperatures on LED lighting components are avoided, thereby extending their useful operating life. Another purpose of the invention is to create a structure preventing the heating of PCB boards.

Another purpose of the invention is to eliminate local hotspots on the PCB. Yet another purpose of the invention is to assure more lumen extraction and a lower cost. Thus, a longer useful operating life is provided for PCB and LED. Yet another purpose of the invention is to generate a compact unit structure for LED and PCB units.

For achievement of the purposes mentioned in the preceding paragraphs, some innovations have been made in PCBs used in multifunctional LED applications, and having an electronic side with circuit components and a LED side with lighting components.

In a preferred embodiment of the invention, the aforementioned innovations are materialized in the form of at least one metal surface (6) coated on the ground of the mentioned electronic side (20) and at least one metal surface coated on the ground of the mentioned LED side, in order to reduce the heating generated in the mentioned PCB by dissipating the same over the board surface.

In a preferred embodiment of the invention, the aforementioned innovations are materialized in the form of at least one pipe located in the inner cross-section or outer surfaces of the mentioned PCB, in order to reduce the heating generated in the mentioned PCB by dissipating the same over the board surface.

In a preferred embodiment of the invention, the aforementioned innovations are materialized in the form of a heat pipe layer functioning as vapor chamber, and at least one PCB made of a plastic material and coated on the mentioned heat pipe layer, and the mentioned PCB's being comprised of at least one electronic side with electronic equipments and a driver circuit on one side, and at least one LED side containing LEDs and located on the other side of PCB.

Present invention is described in more details by the description given in the example model shown in simplified form in the figures attached hereto.

DETAILED DESCRIPTION OF THE INVENTION

The application of the invention depicted in the figures is composed of PCB boards used in LED lightings. The invention relates to cooling units developed in LED applications in automotive industry. The invention also uses advanced printed circuit board technologies. To put it in other words, the invention is based on an advanced board technology that minimizes the heat resistance and renders heat conductivity more efficient and productive compared to standard printed circuit boards.

Figure 3:
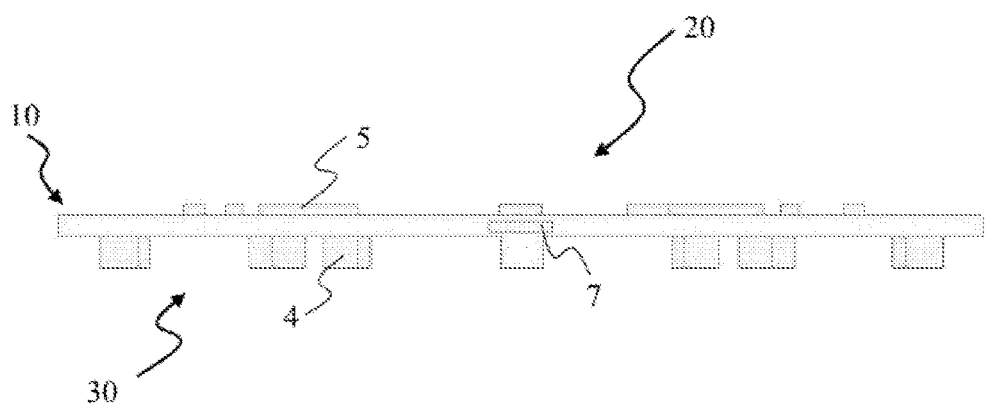
FIG. 3: Cross-sectional view of PCB with a cooling tube in a representative application of the invention.
Figure 4:
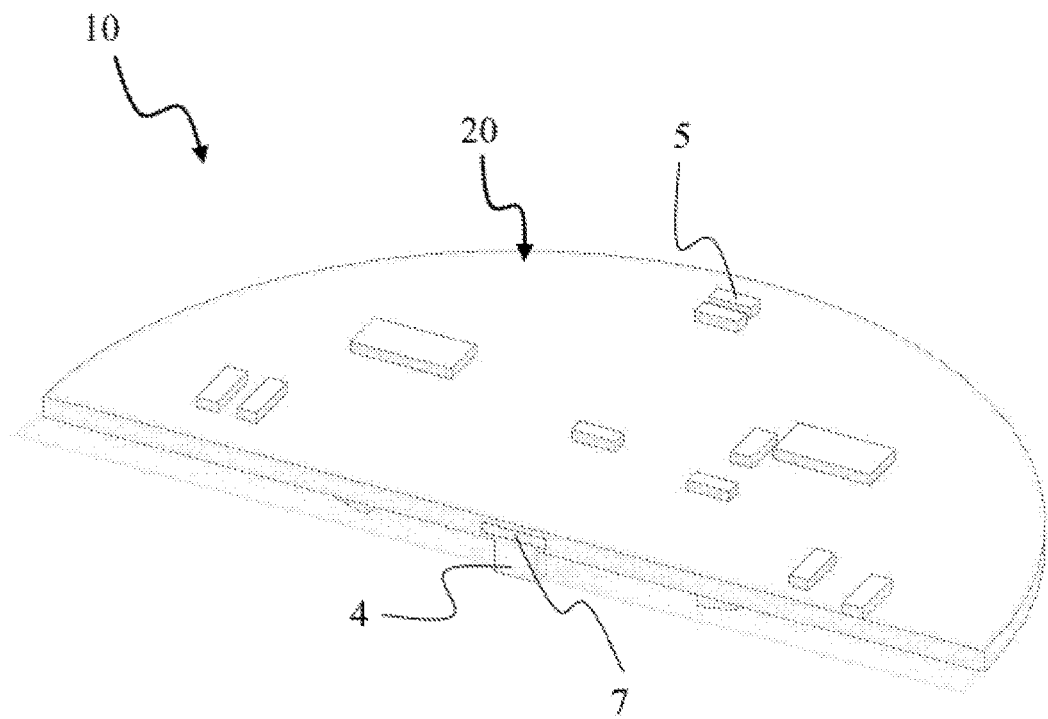
FIG. 4: Cross-sectional view of the electronic side of PCB with a cooling tube in a representative application of the invention.
Figure 5:
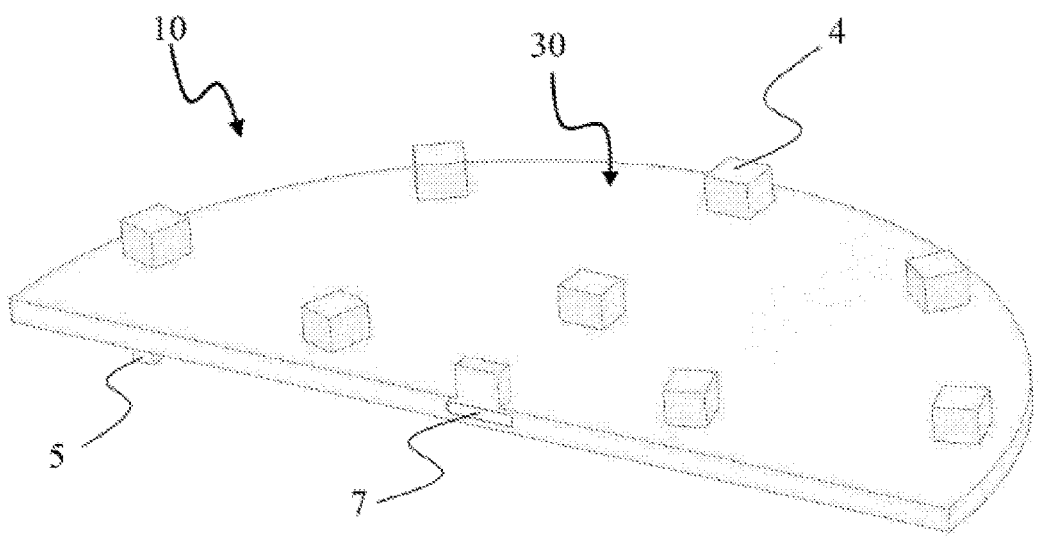
FIG. 5: Cross-sectional view of the LED side of PCB with a cooling tube in a representative application of the invention.
Figure 6:
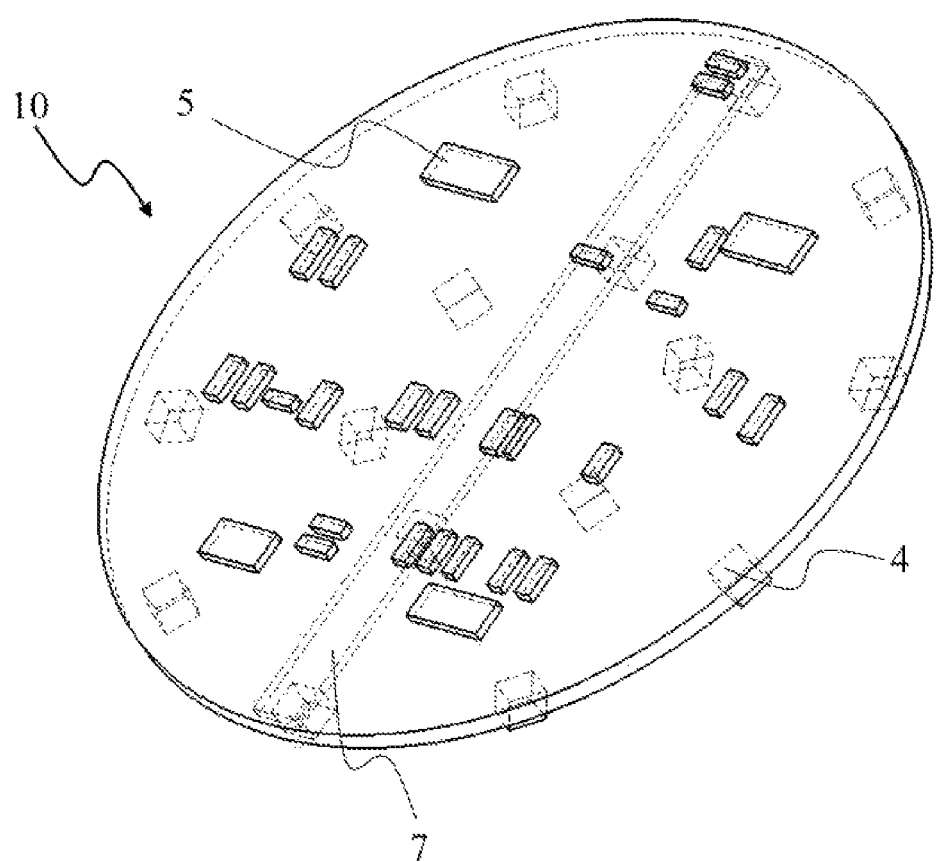
FIG. 6: View of the electronic side of PCB with a cooling tube in a representative application of the invention.

PCBs (10) shown in FIG. 3 have an electronic side (20) with circuit components and a LED side (30) with lighting components in multifunctional LED applications. In the PCB (10) cross-section shown in FIG. 1, a two-sided core layer (1) is present in the middle. There is a dielectric layer (2) interrupting the electrical connection of surfaces of the core layer (1) with each other. A circuit layer (3) is present for placement of LEDs on one surface of dielectric layers (2), and a circuit layer (3) is present for electronic components on the other surface.

Figure 1:
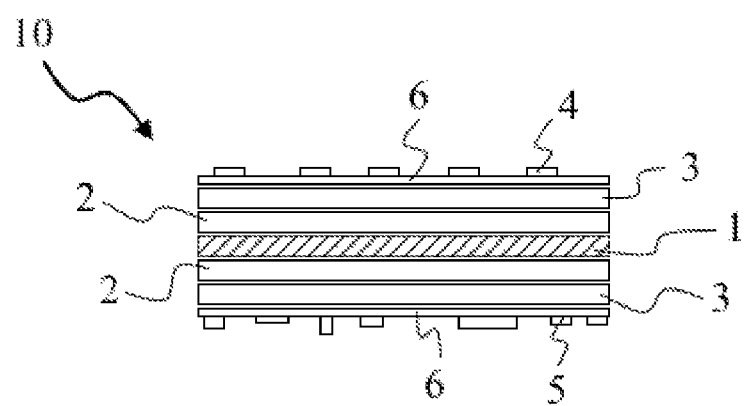
FIG. 1: Schematic cross-sectional view of PCB with its metal coated surfaces in a representative application of the invention.
Figure 2:
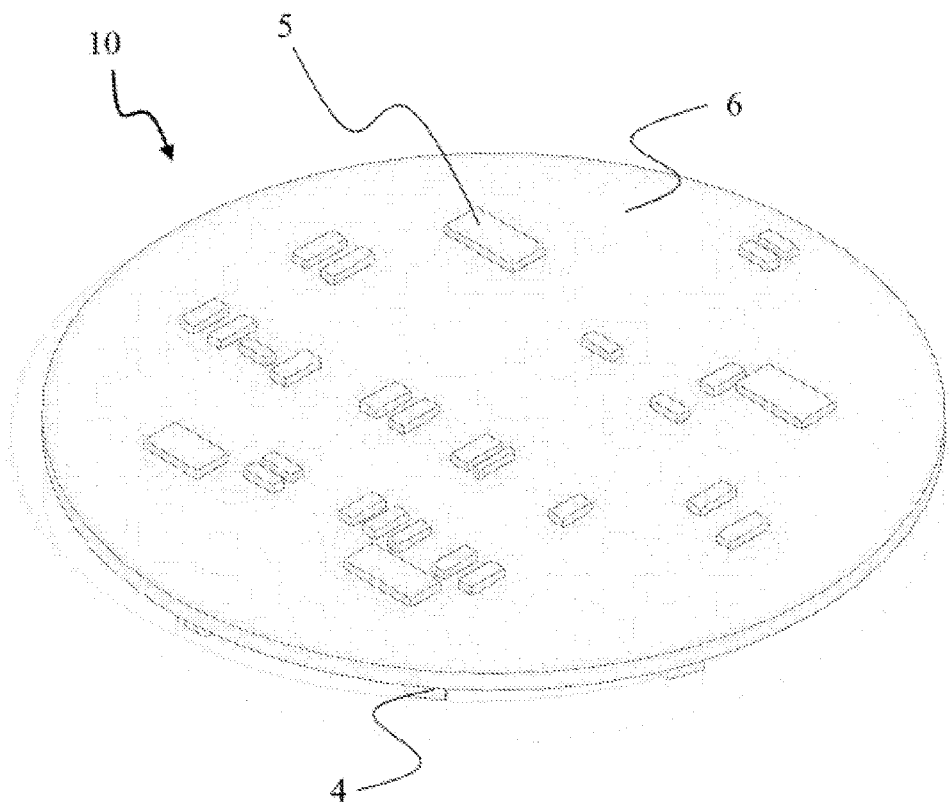
FIG. 2: Perspective view of the electronic side of the cross-sectional view of PCB given in FIG. 1 in a representative application of the invention.

The PCB design, being the subject matter of present invention, offers more than one preferred application examples for a compact unit. Two methods of application employ two different cases:
1—metal coating of both sides of PCB
2—placement of a heat pipe or a vapor chamber in PCB The first case seen in FIGS. 1 and 2 is a metal-coated board. In order to reduce the heating generated in PCB (10) by dissipating it over the surface of board, a metal surface (6) coated on the ground of electronic side (20) and a metal surface (6) coated on the ground of LED side (30) are present. Metal surface (6) may be made of a heat dissipating alloy or copper or aluminum. To put it in other words, it is based on double-sided metal PCB technology for LED application. An application example is a double-sided metal board which has electronics on one side and LEDs (4) on the other side. This design approach replaces the old-fashioned FR4-based PCB technology due to its low thermal performance. Accordingly, the first type of application consists of application of a double-sided (one side for LEDs, the other side for electronics) metal-cored PCB technology. As a result, PCB (10) is expected to enhance the performance above 3× compared to the baseline technology. Preferably, copper or aluminum may be used as a coating material.

The second case seen in FIGS. 3, 4, 5 and 6 is a PCB technology developed on the basis of a built-in heat pipe or vapor chamber for LED applications. In order to reduce the heating generated in PCB (10) by dissipating it over the surface of board, a heat pipe (7) located in inner cross-section or outer surfaces of PCB (10) are employed. Said heat pipe (7) is situated inside the mentioned PCB (10) as a whole or in pieces. Heat pipes (7) are positioned inside the mentioned PCB (10) parallel to or in different directions with each other. Heat pipe (7) may be in flat form. Heat pipes (7) are transmission-based pipes. Even a further improved performance may be achieved if and when heat pipes (7) and heat dissipators are essentially embedded in the system. A detailed CFD (Computational Fluid Dynamics) analysis has been conducted. Analysis results have shown that local hotspots of pipes/chambers bear great importance for reliability and lumen extraction. During PCB (10) manufacturing, preferably, a 1.8-2 mm channel is grooved on the board for the component named heat dissipator or vapor pipe or heat pipe (7), and the heat pipe is placed in that channel. Flattened heat pipes (7) may also be placed in the channels grooved as above.

A heat pipe (7) functioning as a vapor chamber is present in inner cross-section or outer surfaces of PCB (10). PCB (10) is manufactured by plastic coating on the vapor chamber based heat pipe (7) layer. In this type of application, a PCB (10) made of a plastic material coated on a heat pipe (7) layer functioning as a vapor chamber is employed. PCB (10) has an electronic side (20) with an electronic driver circuit on one side. Driver circuit is comprised of electronic components.

PCB (10) has a LED side (30) with LEDs on the other side. LEDs may be in different colors such as white, blue, green and red.

There is an electronic parking sensor with distance measurement function, located on PCB (10) or lighting fixture and connected to the vehicle electronic center, in order to provide the PCB (10) with an electronic sensing function. Parking sensors are positioned both on PCB (10) and on appropriate points of the plastic body on the lamp body to sense the distance. For the purpose of providing the PCB (10) with an electronic sensing function, there is an electronic communication tool located on PCB (10) or lighting fixture, enabling communication between devices and connected to the electronic control center.

With its improved cooling characteristics, PCB (10) can be used in all automotive exterior and interior lighting applications, especially in environments under stringent conditions and in environments where compactness of the system plays a significant role. Local hotspots will be eliminated by showing higher heat conductivity in PCB technology. This will improve local temperatures and facilitate uniform isothermal like performances. This design approach replaces old-fashioned FR4 based PCB technology due to its low thermal performance. This technology will further improve the performance. Thermal coated board not only reduces the cooling effort, but also is less costly. Moreover, in the present invention, double-sided thermal coated board has further reduced the cost by creating a compact system having less local hotspots paving the way for entire solution of cooling problems in automotive lighting applications. This type of board allows simplified designs, compact devices and less complex manufacturing processes, and the elimination of local hotspots increases the useful operating life of the system, which is critical for feasibility of lighting applications in need of high power.

Basic scope of present invention as described in claims will be evaluated without keeping present invention limited by the representative applications specified herein. Thus, alternative structures which may be implemented by persons skilled in the art on the basis of basic and fundamental elements included in the scope of protection described in claims will be treated and considered as an infringement on present invention.

REFERENCE NUMBERS

10 PCB
20 Electronic side
30 LED side
1 Core layer
2 Dielectric layer
3 Circuit layer
4 LED
5 Electronic circuit
6 Metal surface
7 Heat pipe

The invention claimed is:

1. A PCB used in multifunctional LED applications, the PCB having an electronic side with circuit components and an LED side with lighting components, the PCB comprising:
   at least one heat pipe located on an inner cross-section of the PCB, the at least one heat pipe being of a plastic material, the heat pipe being in a flat form and functioning as a vapor chamber in order to reduce heat generated on the PCB by dissipating the heat over a surface of the PCB;
   at least one electronic side having an electronic driver circuit and positioned on one side of the PCB; and
   at least one LED side containing LEDs and positioned on another side of the PCB.

2. The PCB of claim 1, wherein the heat pipe is positioned inside the PCB as a whole or in pieces.

3. The PCB of claim 1, wherein the at least one pipe comprises a plurality of heat pipes positioned inside the PCB in parallel relation or in different directions to each other.

4. The PCB of claim 1, further comprising:
   at least one electronic parking sensor having a distance measurement function, the electronic parking sensor connected to a vehicle electronic sensor.

5. The PCB of claim 1, further comprising:
   at least one electronic communication system that enable communications between devices.

* * * * *